(12) United States Patent
Lai et al.

(10) Patent No.: US 8,581,327 B2
(45) Date of Patent: Nov. 12, 2013

(54) MEMORY AND MANUFACTURING METHOD THEREOF

(75) Inventors: Erh-Kun Lai, Taichung County (TW); Yen-Hao Shih, Changhua County (TW); Ling-Wu Yang, Hsinchu (TW); Chun-Min Cheng, Kaohsiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/974,093

(22) Filed: Dec. 21, 2010

(65) Prior Publication Data
US 2011/0089480 A1    Apr. 21, 2011

Related U.S. Application Data

(62) Division of application No. 11/979,101, filed on Oct. 31, 2007, now Pat. No. 7,879,706.

(51) Int. Cl.
*H01L 29/792*    (2006.01)

(52) U.S. Cl.
USPC ........... 257/324; 438/151; 438/257; 438/300; 438/350; 365/53; 365/218

(58) Field of Classification Search
USPC .................. 257/324, E29.309, 213, 314, 288; 438/151, 257, 300, 350; 365/53, 218
See application file for complete search history.

(56) References Cited

U.S. PATENT DOCUMENTS

| | | | |
|---|---|---|---|
| 6,399,441 B1 | 6/2002 | Ogura et al. | |
| 6,784,476 B2 * | 8/2004 | Kim et al. | 257/296 |
| 2003/0067030 A1 * | 4/2003 | Torii | 257/315 |
| 2003/0075756 A1 * | 4/2003 | Suzuki | 257/315 |
| 2004/0197995 A1 * | 10/2004 | Lee et al. | 438/257 |
| 2006/0202261 A1 * | 9/2006 | Lue et al. | 257/324 |
| 2006/0240623 A1 * | 10/2006 | Lee et al. | 438/257 |
| 2007/0037328 A1 | 2/2007 | Ho et al. | |
| 2007/0268746 A1 * | 11/2007 | Choi et al. | 365/185.05 |

FOREIGN PATENT DOCUMENTS

| | | |
|---|---|---|
| CN | 1534769 | 10/2004 |
| TW | 492088 | 6/2002 |

OTHER PUBLICATIONS

Taiwanese Office Action dated Sep. 22, 2011. English translation unavailable.

* cited by examiner

*Primary Examiner* — Julio J Maldonado
*Assistant Examiner* — Robert Bachner
(74) *Attorney, Agent, or Firm* — Bacon & Thomas, PLLC

(57) ABSTRACT

A memory having isolated dual memory cells is provided. A first isolation wall and a second isolation wall are separately disposed between a source and a drain on a substrate. An isolation bottom layer and a polysilicon layer are orderly disposed on the substrate between the first and the second isolation walls. A first charge storage structure and a first gate are orderly disposed on the substrate between the first isolation wall and the source. A second charge storage structure and a second gate are orderly disposed on the substrate between the second isolation wall and the drain. A word line disposed on the polysilicon layer, the first gate, the second gate, the first isolation wall and the second isolation wall is electrically connected to the first gate, the second gate and the polysilicon layer.

21 Claims, 4 Drawing Sheets

MEMORY AND MANUFACTURING METHOD THEREOF

CROSS REFERENCE TO RELATED APPLICATIONS

This application is a divisional application of application Ser. No. 11/979,101, filed on Oct. 31, 2007, now U.S. Pat. No. 7,879,706 issued Feb. 1, 2011 and entitled "MEMORY AND MANUFACTURING METHOD THEREOF", the contents of which are incorporated herein by reference.

BACKGROUND OF THE INVENTION

1. Field of the Invention

The invention relates in general to a memory and a manufacturing method thereof, and more particularly to a memory with an isolation wall separating two charge storage layers and a manufacturing method thereof.

2. Description of the Related Art

As portable electronic products become more and more popular, the demand for flash memories grows rapidly in the market. When applied to memories on a main board or small-size memory cards, nonvolatile storage provided by flash memories breaks the limit of conventional optical and magnetic storage. The flash memory is stable and has low energy consumption. Also, there is no need to move components in the device. Therefore, the flash memory is an ideal solution for the nonvolatile storage of programs and data in the portable electronic products.

The flash memories in the present market are substantially divided into two types, NOR type and NAND type. The NOR type flash memories are based on Not-OR logical structure, and the NAND type flash memories are based on Not-AND logical structure. Compared to the NAND type structure, the NOR type structure speeds up data reading and reduces the time for bit rewriting through the parallel configuration. However, the NAND type structure has smaller memory cells and individual blocks than the NOR type structure. Also, the NAND structure has low energy consumption when programming and is faster in programming and erasing. Besides, the memory cell array of the NAND structure has higher density, so that the memory capacity per square millimeter is increased.

As to the present nonvolatile nitride memory, a nitride layer for storing charges generates two bits when the memory is programming. However, when the portable electronic products become smaller and lighter, the volume of the memory has to be reduced accordingly. Therefore, the two bits storing in the nitride layer interfere with each other when the memory is programming. Second bit effect occurs when the memory reads the two bits. As a result, the reliability and practicability of the memory is decreased greatly.

SUMMARY OF THE INVENTION

The invention is directed to a memory and a manufacturing method thereof. An isolation wall separates two charge storage layers, so that the two charge storage layers do not interfere with each other when the memory is programming. Therefore, second bit effect is avoided when the memory reads the two bits. The reliability and practicability of the memory is improved significantly.

According to a first aspect of the present invention, a memory is provided. The memory includes a substrate, a source, a drain, a first isolation wall, a second isolation wall, an isolation bottom layer, a conductive layer, a first charge storage structure, a second charge storage structure, a first gate, a second gate and a word line. The source and the drain are separately disposed on a surface of the substrate. The first isolation wall and the second isolation wall are separately disposed on the substrate and positioned between the source and the drain. The isolation bottom layer is disposed on the substrate and positioned between the first isolation wall and the second isolation wall. The conductive layer is disposed on the isolation bottom layer and positioned between the first isolation wall and the second isolation wall. The first charge storage structure is disposed on the substrate and positioned between the first isolation wall and the source. The first gate is disposed on the first charge storage structure. The second charge storage structure is disposed on the substrate and positioned between the second isolation wall and the drain. The second gate is disposed on the second charge storage structure The word line is disposed on the conductive layer, the first gate, the second gate, the first isolation wall and the second isolation wall. The word line is electrically connected to the first gate, the second gate and the conductive layer.

According to a second aspect of the present invention, a manufacturing method of a memory is provided. First, a substrate is provided. Next, a first dielectric material layer, a first storage material layer, a first blocking material layer, a first gate material layer and a first isolation material layer are formed on the substrate orderly. Then, part of the first isolation material layer, part of the first gate material layer, part of the first blocking material layer, part of the first storage material layer and part of the first dielectric material layer are removed orderly to form a second isolation material layer, a second gate material layer, a second blocking material layer, a second storage material layer and the second dielectric layer. Afterwards, the substrate is defined to form a source and a drain. Subsequently, a third isolation material layer is formed on the source and the drain. Then, the second isolation material layer is removed. Thereon, part of the second gate material layer, part of the second blocking material layer, part of the second storage material layer and part of the second dielectric material layer are removed to form a first tunneling dielectric layer, a second tunneling dielectric layer, a first charge storage layer, a second charge storage layer, a first blocking layer, a second blocking layer, a first gate and a second gate in an opening. Then, a first isolation wall, a second isolation wall and an isolation bottom layer are formed in the opening. The first isolation wall and the second isolation wall are separately formed on the substrate. The first tunneling dielectric layer, the first charge storage layer, the first blocking layer and the first gate are formed between the first isolation wall and the source. The second tunneling dielectric layer, the second charge storage layer, the second blocking layer and the second gate are formed between the second isolation wall and the drain. The isolation bottom layer is formed on the substrate and positioned between the first isolation wall and the second isolation wall. Then, a conductive layer is formed among the isolation bottom layer, the first isolation wall and the second isolation wall. Thereon, part of the third isolation material layer is removed to form a fourth isolation material layer, and the surfaces of the first gate, the first isolation wall, the conductive layer, the second isolation wall and the second gate are exposed. Next, a word line is formed to cover the surfaces of the fourth isolation material layer, the first gate, the first isolation wall, the conductive layer, the second isolation wall and the second gate. The word line is electrically connected to the first gate, the conductive layer and the second gate.

The invention will become apparent from the following detailed description of the preferred but non-limiting embodiments. The following description is made with reference to the accompanying drawings.

DETAILED DESCRIPTION OF THE INVENTION

Figure 1:
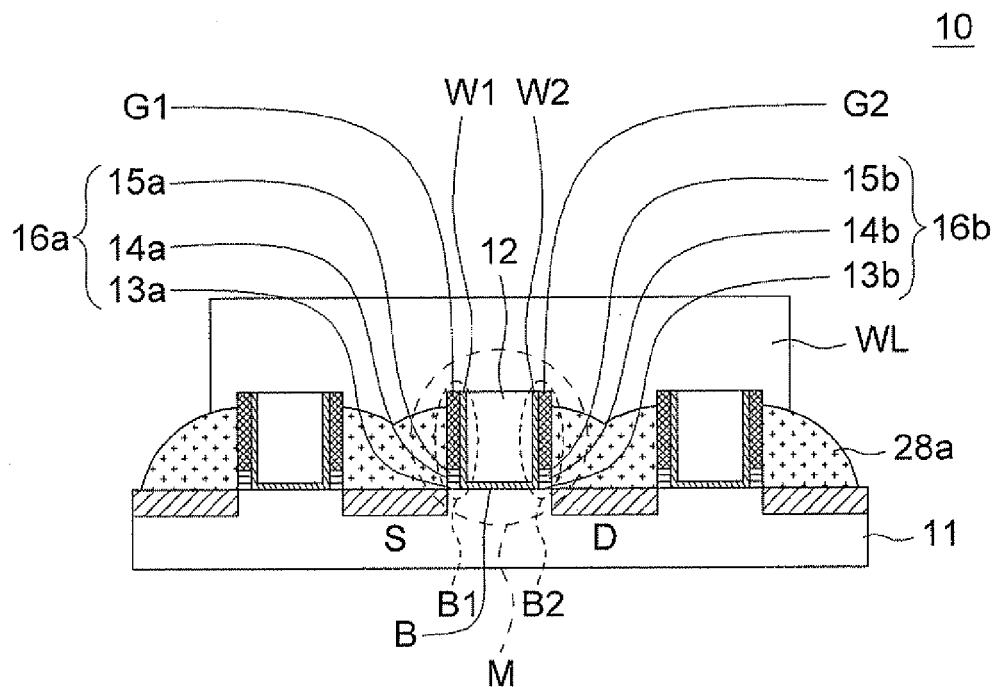
FIG. 1 is a cross-sectional view of a memory according to a preferred embodiment of the present invention.

FIG. 1 is a cross-sectional view of a memory according to a preferred embodiment of the present invention. Please referring to FIG. 1, the memory 10 includes a substrate such as silicon substrate 11, a source S, a drain D, a first isolation wall W1, a second isolation wall W2, an isolation bottom layer B, a conductive layer such as polysilicon layer 12, a first charge storage structure 16a, a second charge storage structure 16b, a first gate G1, a second gate G2 and a word line WL. The source S and the drain D are separately disposed on a surface of the silicon substrate 11. The first isolation wall W1 and the second isolation wall W2 are separately disposed on the silicon substrate 11 and positioned between the source S and the drain D. The isolation bottom layer B is disposed on the silicon substrate 11 and positioned between the first isolation wall W1 and the second isolation wall W2. The polysilicon layer 12 is disposed on the isolation bottom layer B and positioned between the first isolation wall W1 and the second isolation wall W2. The first charge storage structure 16a is disposed on the silicon substrate 11. In the present embodiment, the first charge storage structure 16a includes a first tunneling dielectric layer 13a, a first charge storage layer 14a and a first blocking layer 15a. The first tunneling dielectric layer 13a is disposed on the silicon substrate 11. The first charge storage layer 14a is disposed on the first tunneling dielectric layer 13a. The first blocking layer 15a is disposed on the first charge storage layer 14a. The first gate G1 is disposed on the first blocking layer 15a. The first tunneling dielectric layer 13a, the first charge storage layer 14a, the first blocking layer 15a and the first gate G1 are positioned between the first isolation wall W1 and the source S. The second charge storage structure 16b is disposed on the silicon substrate 11. In the present embodiment, the first charge storage structure 16b includes a first tunneling dielectric layer 13b, a first charge storage layer 14b and a first blocking layer 15b The second tunneling dielectric layer 13b is disposed on the silicon substrate 11. The second charge storage layer 14b is disposed on the second tunneling dielectric layer 13b. The second blocking layer 15b is disposed on the second charge storage layer 14b. The second gate G2 is disposed on the second blocking layer 15b. The second tunneling dielectric layer 13b, the second charge storage layer 14b, the second blocking layer 15b and the second gate G2 are positioned between the second isolation wall W2 and the drain D. The word line WL is disposed on the polysilicon layer 12, the first gate G1, the second G2, the first isolation wall W1 and the second isolation wall W2. Also, the word line WL is electrically connected to the first gate G1, the second gate G2 and the polysilicon layer 12.

The source S, the drain D, the first tunneling dielectric layer 13a, the second tunneling dielectric layer 13b, the first charge storage layer 14a, the second charge storage layer 14b, the first blocking layer 15a, the second blocking layer 15b, the first gate G1 and the second gate G2 form a memory cell M. The first charge storage layer 14a and the second charge storage layer 14b provide a first bit B1 and a second bit B2 respectively for storing data. What needs to notice is that the first isolation wall W1 and the second isolation wall W2 separate the first charge storage layer 14a and the second charge storage layer 14b. Thus the memory including the first charge storage layer 14a and the second charge storage layer 14b has discrete, separate dual memory cell structure. As a result, the first charge storage layer 14a and the second charge storage layer 14b do not interfere with each other when the memory is programming. Second bit effect is avoided when the memory 10 reads the first bit B1 and the second bit B2. Moreover, the effect that the conductivity of channel is reduced resulting from charge trapped in the first charge storage layer 14a and the second charge storage layer 14b can be decreased.

In the present embodiment, the first charge storage layer 14a and the second charge storage layer 14b are first nitride layers, and can be replaced by high dielectric constant material (high-k material). Furthermore, the first blocking layer 15a and the second blocking layer 15b are first oxide layers, and can be replaced by high-k material, too. The first tunneling dielectric layer 13a and the second tunneling dielectric layer 13b are second oxide layers. As a result, the first tunneling dielectric layer 13a, the first charge storage layer 14a and the first blocking layer 15a form an ONO stack structure. The second tunneling dielectric layer 13b, the second charge storage layer 14b and the second blocking layer 15b form an ONO stack structure as well. The memory 10 has SONOS structure, and hot carrier electron (HCE) method can be used to inject electron for programming, and band-to-band hot hole (BBHH) method or positive Fowler-Nordheim (+FN) method can be used to inject hole for erasing. Otherwise, BBHH method is used to inject hole for programming, and −FN method is used to inject electron for erasing.

Figure 3:
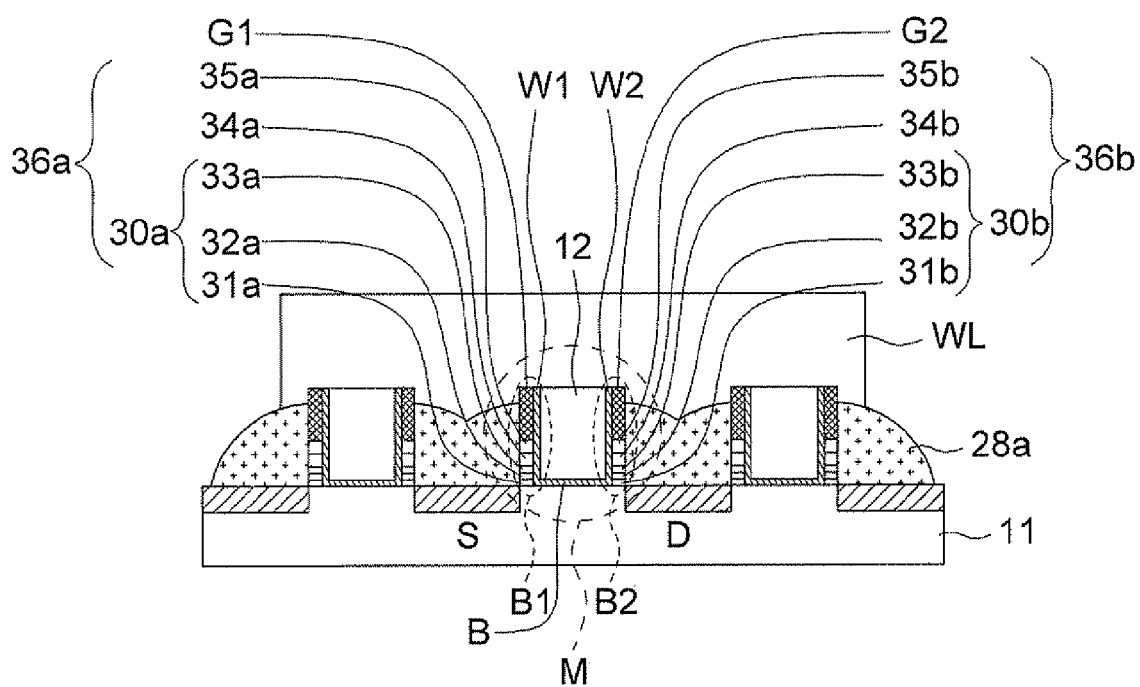
FIG. 3 is a cross-sectional view of another memory according to a preferred embodiment of the present invention.

Referring to FIG. 3, a cross-sectional view of another memory according to a preferred embodiment of the present invention is shown. As shown FIG. 3, the memory 10a differs from memory 10 in the first charge storage structure and the second charge storage structure. The first charge storage structure 36a includes a first tunneling dielectric layer 30a, a first charge storage layer 34a and the first blocking layer 35a. The second charge storage structure includes a second tunneling dielectric layer 30b, a second charge storage layer 34b and a second blocking layer 35b.

In memory 10a, the first tunneling dielectric layer 30a and the second tunneling dielectric layer 30b individually includes first dielectric layers 31a, 31b, second dielectric layers 32a, 32b, and third dielectric layers 33a, 33b. The first dielectric layer 31a, 31b are respectively disposed on the silicon substrate. The second dielectric layers 32a, 32b are respectively disposed on the first dielectric layers 31a, 31b. The third dielectric layers 33a, 33b are respectively disposed on the second dielectric layers 32a, 32b. The thickness of the first dielectric layers 31a, 31b is less than 20 angstroms (Å), ranges between 5 Å-20 Å, or is less than 15 Å. The thickness of the second dielectric layers 32a, 32b is less than 20 Å or ranges between 10 Å-20 Å. The thickness of the third dielectric layers 33a, 33b is less than 35 Å or ranges between 10 Å-20 Å. In memory 10a, the first dielectric layers 31a, 31b, the second dielectric layers 32a, 32b and the third dielectric layers 33a, 33b are respectively second oxide layers, second nitride layers and third oxide layers. The second nitride layers are disposed between the second oxide layers and the third oxide layers. Therefore, the first tunneling dielectric layer 30a, the first charge storage layer 34a and the first blocking layer 35a form an ONONO stack structure. The second tunneling dielectric layer 30b, the second charge storage layer 34b and the second blocking layer 35b form an ONONO stack structure as well. Thus a memory of SONONOS, i.e., so-called bandgap engineered SONOS (BE-SONOS) structure is formed. The programming and erasing methods are the same as those of memory 10.

The ONONO stack structure has a small hole tunneling barrier, such as less than or equal to about 4.5 eV, or more preferably less than or equal to about 1.9 eV. Additional details of various embodiments of the BE-SONOS structure are disclosed in U.S. application Ser. No. 11/324,540, which is incorporated herein by reference.

Otherwise, the first tunneling dielectric layer 30a and the second tunneling dielectric layer 30b preferably both include a second oxide layer, a thin polysilicon layer and a third oxide layer. The polysilicon layer is disposed between the second oxide layer and the third oxide layer. Therefore, the first tunneling dielectric layer 30a, the first charge storage layer 34a and the first blocking layer 35a form an ONOPO stack structure. The second tunneling dielectric layer 30b, the second charge storage layer 34b and the second blocking layer 35b form an ONOPO stack structure as well. The programming and erasing methods are the same as those of memories 10 and 10a.

Furthermore, respectively in the first charge storage structure and the second charge storage structure, the first blocking layer and the second blocking layer can be disposed on the silicon substrate 11. The first and the second charge storage layers are respectively disposed on the first and the second blocking layers. The first and the second tunneling dielectric layers are respectively disposed on the first and the second charge storage layers. Thus the memory which carriers injected from the gate is formed. Likewise, the first tunneling dielectric layer and the second tunneling dielectric layer can use ONO stack layer or OPO stack layer so as to form memory of Top BE-SONOS or OPONO structure. The programming methods of memory of Top BE-SONOS or OPONO structure are the same as memory 10 and 10a, but the erasing method thereof can use only +FN or −FN method. Otherwise, if the material of the first and the second tunneling dielectric layers is aluminum oxide, and the material of the first and the second gate is tantalum nitride, then the memory of TANOS structure is formed. The programming and the erasing methods of the memory of TANOS structure is the same as those of memories of 10 and 10a. If the material of the first and the second tunneling dielectric layers is silicon oxide, then the memory of gate-injecting SONOS structure is formed. Besides, the first and the second tunneling dielectric layer can not be formed, and the first and the second gates are directly disposed on the first and the second charge storage layer, respectively. Thus the memory of SNOS structure is formed. The programming method of the memory of SNOS structure is the same as that of the memories 10 and 10a, but the erasing method can use only +FN and −FN method.

As shown in FIG. 1, the first gate G1 and the second gate G2 are made of polysilicon. Furthermore, the surfaces of the first gate G1, the second gate G2, the polysilicon layer 12, the first isolation wall W1 and the second isolation wall W2 are aligned to each other. Moreover, the first isolation wall W1, the second isolation wall W2 and the isolation bottom layer B are formed integrally. The first isolation wall W1, the second isolation wall W2 and the isolation bottom layer B form a structure with a U-shaped cross-section. The first isolation wall W1, the second isolation wall W2 and the isolation bottom wall B respectively include oxide. What needs to notice is that the memory 10 further includes a fourth isolation material layer 28a disposed on the source S and the drain D. The fourth isolation material layer 28a is covered by the word line WL.

A manufacturing method of the memory according to the memory 10 in the present embodiment is illustrated as follow. However, the present embodiment is not limited thereto.

Please referring to FIGS. 2A-2G, cross-sectional views of the manufacturing process of the memory according to the preferred embodiment of the present invention are illustrated in FIGS. 2A-2G.

Figure 2A:
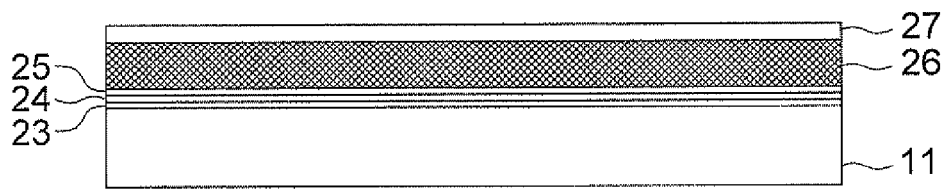
FIGS. 2A-2G are cross-sectional views of a manufacturing process of the memory according to the preferred embodiment of the present invention.

First, as shown in FIG. 2A, a silicon substrate 11 is provided. Next, a first dielectric material layer 23, a first storage material layer 24, a first blocking material layer 25, a first gate material layer 26 and a first isolation material layer 27 are formed orderly on the silicon substrate 11. The first blocking material layer 25 and the first storage material layer 24 are a first oxide material layer and a first nitride material layer respectively. The first dielectric material layer 23 is preferably a second oxide material layer. Or, the first dielectric material layer 23 preferably includes a second oxide material layer, a second nitride material layer and a third oxide material layer. The second nitride material layer is formed between the second oxide material layer and the third oxide material layer. Otherwise, the first dielectric material layer 23 preferably includes a second oxide material layer, a polysilicon material layer and a third oxide material layer. The polysilicon material layer is formed between the second oxide material layer and the third oxide material layer.

Figure 2B:
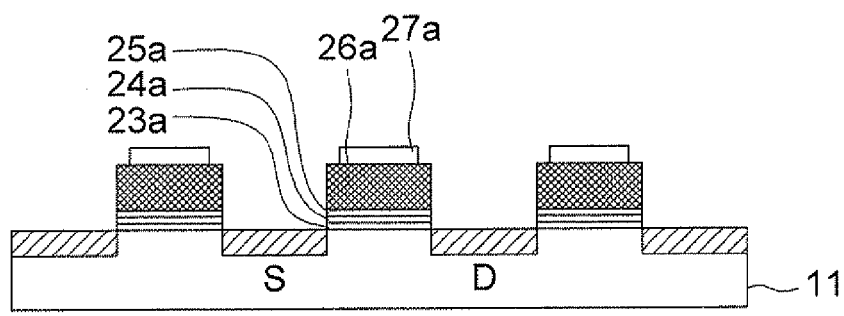

Next, as shown in FIG. 2B, part of the first isolation material layer 27, part of the first gate material layer 26, part of the first blocking material layer 25, part of the first storage material layer 24 and part of the first dielectric material layer 23 are removed orderly to form a second isolation material layer 27a, a second gate material layer 26a, a second blocking material layer 25a, a second storage material layer 24a and a second dielectric material layer 23a. Also, part of the surface of the silicon substrate 11 is exposed. Then, the silicon substrate 11 is defined to form a source S and a drain D. Meanwhile, several bit lines are formed. The step of forming the source S and the drain D is preferably performed through ion implantation.

Figure 2C:
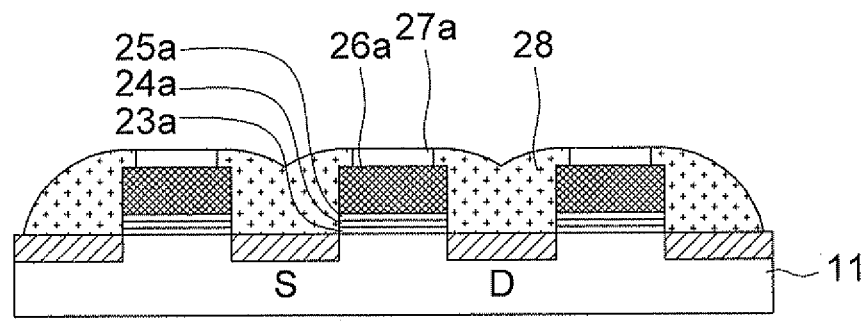

Afterwards, as shown in FIG. 2C, a third isolation material layer 28 is formed on the source S and the drain D. The third isolation material layer 28 is preferable made of oxide. Furthermore, the entire isolation layer is preferably formed through low pressure TEOS (LPTEOS) deposition. Then, the third isolation material layer 28 is formed by etching back the entire isolation layer and has substantially uniform and flat surface. Or, the entire isolation layer is preferably formed through high density plasma (HDP) deposition. Then, the entire isolation layer is trimmed by an etch-back process. For example, the entire isolation layer is trimmed by using hydrofluoric (HF) acid. As a result, the third isolation material layer 28 is formed and has substantially uniform and flat surface as well. Meanwhile, the third isolation material layer 28 has a triangular cross-section on part of the second isolation material layer 27a.

Figure 2D:
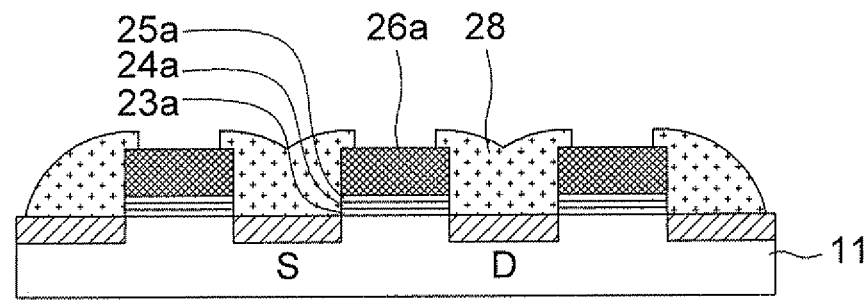

Next, as shown in FIG. 2D, the second isolation material layer 27a is removed. The second isolation material layer 27a is a silicon nitride layer. The step of removing the second isolation material layer 27a is performed by soaking in phosphoric acid ($H_3PO_4$).

Figure 2E:
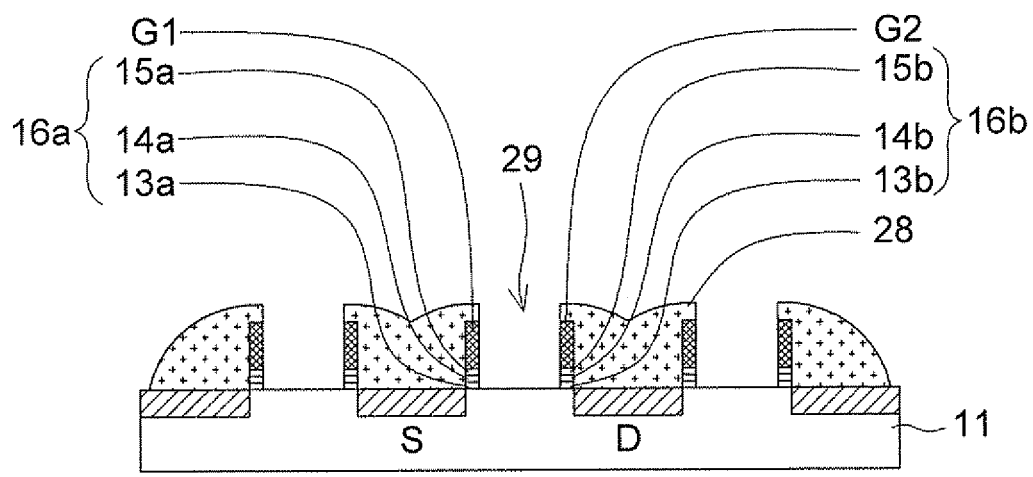

Subsequently, as shown in FIG. 2E, part of the second gate material layer 26a, part of the second blocking material layer 25a, part of the second storage material layer 24a and part of the second dielectric material layer 23a are removed to form a first tunneling dielectric layer 13a, a second tunneling dielectric layer 13b, a first charge storage layer 14a, a second charge storage layer 14b, a first blocking layer 15a, a second blocking layer 15b, a first gate G1 and a second gate G2 in an opening 29. In other words, the first charge storage structure 16a and the second charge storage structure 16b are formed in the step. The first tunneling dielectric layer 13a and the second tunneling dielectric layer 13b are separately formed on the silicon substrate 11. The first charge storage layer 14a and the second charge storage layer 14b are formed respectively on the first tunneling dielectric layer 13a and the second tunneling dielectric layer 13b. The first blocking layer 15a and the second blocking layer 15b are formed respectively on the first charge storage layer 14a and the second charge storage layer 14b. The first gate G1 and the second gate G2 are formed respectively on the first blocking layer 15a and the second blocking layer 15b. Part of the material exposed by the third isolation material layer 28 is etched in this step, that is, removing part of the second gate material layer 26a, the second blocking material layer 25a, the second storage material layer 24a and the second dielectric material layer 23a is performed through a self-aligned etching process. As a result, the positions of source S and the drain D can precisely correspond to the positions of the tunneling dielectric layers, the charge storage layers and the blocking layers.

Figure 2F:
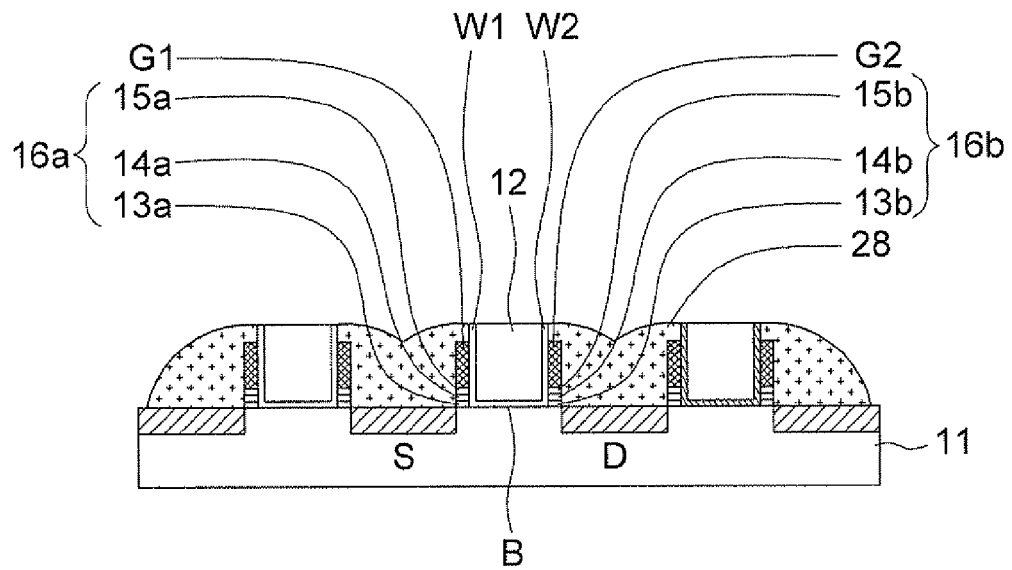

Then, as shown in FIG. 2F, a first isolation wall W1, a second isolation wall W2 and an isolation bottom layer B are formed in the opening 29. The first isolation wall W1 and the second isolation wall W2 are separately formed on the silicon substrate 11. The first tunneling dielectric layer 13a, the first charge storage layer 14a, the first blocking layer 15a and the first gate G1 are formed between the first isolation wall W1 and the source S. The second tunneling dielectric layer 13b, the second charge storage layer 14b, the second blocking layer 15b and the second gate G2 are formed between the second isolation wall W2 and the drain D. The isolation bottom layer B is formed on the silicon substrate 11 and positioned between the first isolation wall W1 and the second isolation wall W2. The isolation bottom layer B, the first isolation wall W1 and the second isolation wall W2 are formed integrally at the same time. Thereon, a polysilicon layer 12 is formed among the isolation bottom layer B, the first isolation wall W1 and the second isolation wall W2.

Figure 2G:
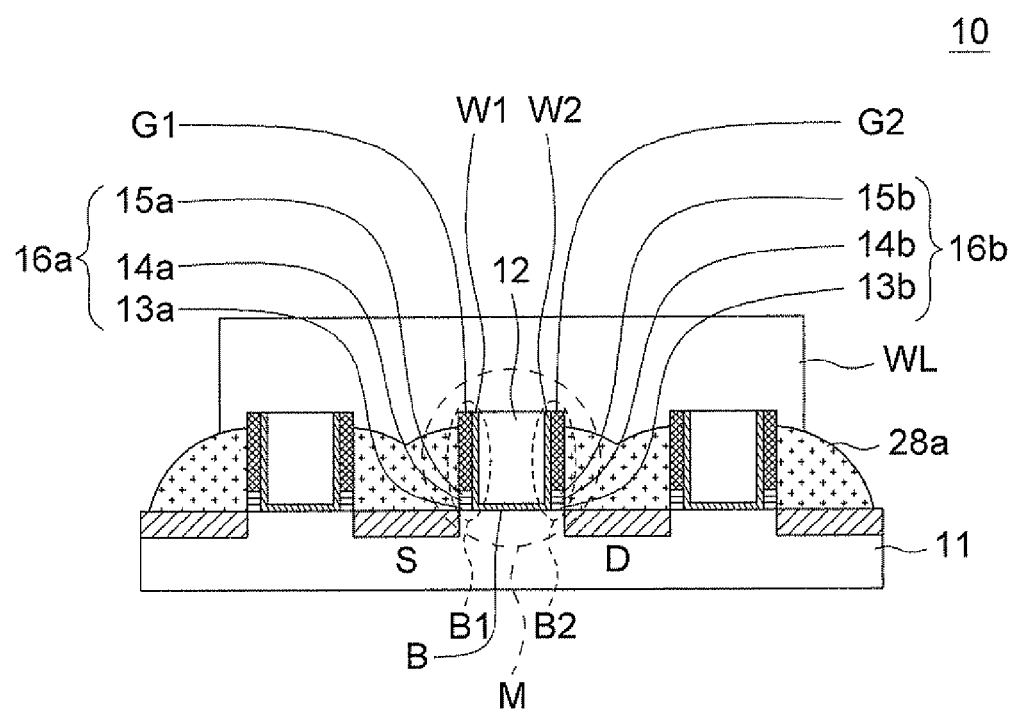

Afterwards, as shown in FIG. 2G, part of the third isolation material layer 28 is removed to form a fourth isolation material layer 28a, and the surfaces of the first gate, the first isolation wall, the polysilicon layer, the second isolation wall and the second gate are exposed. Part of the polysilicon layer 12 and part of the third isolation material layer 28 are removed through the etch back process, so that the surfaces of the first gate G1, the second gate G2, the polysilicon layer 12, the first isolation wall W1 and the second isolation wall W2 are aligned to each other. Or, part of the polysilicon layer 12 and part of the third isolation material layer 28 are removed orderly through chemical mechanical polishing/planarization (CMP), so that the surfaces of the first gate G1, the second gate G2, the polysilicon layer 12, the first isolation wall W1 and the second isolation wall W2 are aligned to each other. Next, a word line WL is formed to cover the surfaces of the fourth isolation material layer 28a, the first gate G1, the first isolation wall W1, the polysilicon layer 12, the second isolation wall W2 and the second gate G2. The word line WL is electrically connected to the first gate G1, the polysilicon layer 12 and the second gate G2. Then, the memory 10 is formed completely.

In the memory and the manufacturing method thereof according to the above embodiment of the present invention, the isolation walls separate the two charge storage layers. As a result, the charge storage layers do not interfere with each other when the memory is programming. Therefore, the second bit effect is avoided when the memory reads the two bits. The reliability and practicability of the memory is improved greatly.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory comprising:
   at least two memory cells, each memory cell comprising:
      an isolation bottom layer formed on a substrate and positioned between a first isolation wall and a second isolation wall;
      a conductive layer disposed on the isolation bottom layer and positioned between the first isolation wall and the second isolation wall;
      a first charge storage structure formed on the substrate and disposed adjacent to the first isolation wall and separated with the conductive layer by the first isolation wall; and
      a second charge storage structure formed on the substrate and disposed adjacent to the second isolation wall and separated with the conductive layer by the second isolation wall;
      a first gate and a second gate respectively disposed on the first and the second charge storage structures;
   a patterned isolation material layer disposed outside the first and the second charge storage structures and filling up spaces between adjacent memory cells, wherein the patterned isolation material layer directly contacts the first gate and the first charge storage structure of the memory cell and also directly contacts another second gate and another second charge storage structure of another adjacent memory cell; and
   a word line formed above and covering top surfaces of the first gate, the first isolation wall, the conductive layer, the second isolation wall and the second gate;
   wherein the word line is formed above a top surface of the patterned isolation material layer and covers a portion of the top surface of the patterned isolation material layer, thereby exposing another portion of the patterned isolation material layer.

2. The memory according to claim 1, wherein the first charge storage structure and the second charge storage structure individually comprises:
   a first charge storage layer and a second charge storage layer, respectively disposed between the first gate and the substrate, and between the second gate and the substrate; and
   a first blocking layer and a second blocking layer, respectively disposed next to the first charge storage layer and the second charge storage layer.

3. The memory according to claim 2, wherein the first charge storage layer and the second charge storage layer are first nitride layers.

4. The memory according to claim 2, wherein the first blocking layer and the second blocking layer are first oxide layers or aluminum oxide layers.

5. The memory according to claim 2, wherein the first charge storage structure and the second charge storage structure individually comprise:
a first tunneling dielectric layer and a second tunneling dielectric layer, respectively disposed next to the first charge storage layer and the second charge storage layer.

6. The memory according to claim 5, wherein the first tunneling dielectric layer and the second tunneling dielectric layer are second oxide layers.

7. The memory according to claim 5, wherein the first tunneling dielectric layer and the second tunneling dielectric layer individually comprises a first dielectric layer, a second dielectric layer and a third dielectric layer, wherein the first dielectric layer is disposed on the substrate, the second dielectric layer is disposed on the first dielectric layer, and the third dielectric layer is disposed on the second dielectric layer.

8. The memory according to claim 7, wherein the first dielectric layer, the second dielectric layer and the third dielectric layer are respectively a second oxide layer, a second nitride layer and a third oxide layer, and the second nitride layer is disposed between the second oxide layer and the third oxide layer.

9. The memory according to claim 7, wherein the first dielectric layer, the second dielectric layer and the third dielectric layer are respectively a second oxide layer, a second conductive layer and a third oxide layer, and the second conductive layer is disposed between the second oxide layer and the third oxide layer.

10. The memory according to claim 7, wherein the thickness of the first dielectric layer is less than 20 angstroms (Å).

11. The memory according to claim 7, wherein the thickness of the second dielectric layer is less than 20 Å.

12. The memory according to claim 7, wherein the thickness of the third dielectric layer is less than 35 Å.

13. The memory according to claim 2, wherein the material of the first gate and the second gate are polysilicon or tantalum nitride.

14. The memory according to claim 2, wherein the surfaces of the first gate, the second gate, the conductive layer, the first isolation wall and the second isolation wall are aligned to each other.

15. The memory according to claim 1, wherein the first isolation wall, the second isolation wall and the isolation bottom layer are formed integrally.

16. The memory according to claim 1, wherein the first isolation wall, the second isolation wall and the isolation bottom layer form a structure with a U-shaped cross-section.

17. The memory according to claim 1, wherein the first isolation wall, the second isolation wall and the isolation bottom layer all comprise an oxide layer.

18. The memory according to claim 1, wherein the material of the conductive layer is polysilicon.

19. A memory, comprising:
at least two memory cells formed on a substrate, each memory cell comprising:
a source and a drain;
an isolation bottom layer formed on the substrate and positioned between a first isolation wall and a second isolation wall;
a conductive layer disposed on the isolation bottom layer and positioned between the first isolation wall and the second isolation wall;
a first charge storage structure formed on the substrate and disposed adjacent to the first isolation wall and separated with the conductive layer by the first isolation wall;
a second charge storage structure formed on the substrate and disposed adjacent to the second isolation wall and separated with the conductive layer by the second isolation wall, wherein the first and the second charge storage structures are positioned between the source and the drain;
a first gate and a second gate respectively disposed on the first and the second charge storage structures;
a patterned isolation material layer disposed outside the first and the second charge storage structures and filling up spaces between adjacent memory cells, wherein the source and the drain are entirely covered by the patterned isolation material layer, wherein the patterned isolation material layer directly contacts the first gate and the first charge storage structure of the memory cell, and also directly contacts another second gate and another second charge storage structure of another adjacent memory cell, and wherein the top surface of the patterned isolation material layer is lower than the top surfaces of the first gate, the first isolation wall the, conductive layer, the second isolation wall and the second gate, thereby exposing the top surfaces of the first gate, the first isolation wall, the conductive layer, the second isolation wall and the second gate; and
a word line formed above and covering top surfaces of the first gate, the first isolation wall, the conductive layer, the second isolation wall and the second gate;
wherein the word line is formed above a top surface of the patterned isolation material layer and covers a portion of the top surface of the patterned isolation material layer, thereby exposing another portion of the patterned isolation material layer.

20. The memory according to claim 19, wherein one side of the source is aligned with an outer surface of the first charge storage structure, while one side of the drain is aligned with an outer surface of the second charge storage structure.

21. The memory according to claim 1, wherein the top surface of the patterned isolation material layer is lower than the top surfaces of the first gate, the first isolation wall, the conductive layer, the second isolation wall and the second gate, thereby exposing the top surfaces of the first gate, the first isolation wall, the conductive layer, the second isolation wall and the second gate.

* * * * *